United States Patent [19]

Erler

[11] 4,006,370
[45] Feb. 1, 1977

[54] FAST TURN-OFF CIRCUIT FOR POWER TRANSISTOR

[75] Inventor: Irvin Leslie Erler, Waynesboro, Va.

[73] Assignee: General Electric Company, New York, N.Y.

[22] Filed: Dec. 15, 1975

[21] Appl. No.: 640,985

[52] U.S. Cl. .............. 307/300; 307/253; 307/202 R
[51] Int. Cl.² .................. H03K 3/33; H03K 17/60
[58] Field of Search ......... 307/280, 275, 300, 253, 307/202

[56] References Cited

UNITED STATES PATENTS

| 3,050,636 | 8/1962 | Sommerfield | 307/280 |
|---|---|---|---|
| 3,083,303 | 3/1963 | Knowles et al. | 307/280 |
| 3,158,751 | 11/1964 | Nelson | 307/275 |
| 3,200,261 | 8/1965 | Fischman et al. | 307/275 |
| 3,470,391 | 9/1969 | Granger | 307/280 |
| 3,597,635 | 8/1971 | Reich | 307/275 |
| 3,617,845 | 11/1971 | McKenna | 318/341 |
| 3,671,773 | 5/1971 | Cardwell, Jr. | 307/275 |
| 3,805,094 | 4/1974 | Orlando | 307/300 |

Primary Examiner—Stanley D. Miller, Jr.
Attorney, Agent, or Firm—Stephen A. Young; Walter C. Bernkopf; Robert A. Cahill

[57] ABSTRACT

In a system for energizing the load from a voltage source there is provided a power transistor and regenerative feedback means coupled between a collector and base of the power transistor for only feeding back to the base a signal responsive to an increasing potential sensed at the collector to reduce the time necessary to turn off the power transistor.

2 Claims, 1 Drawing Figure

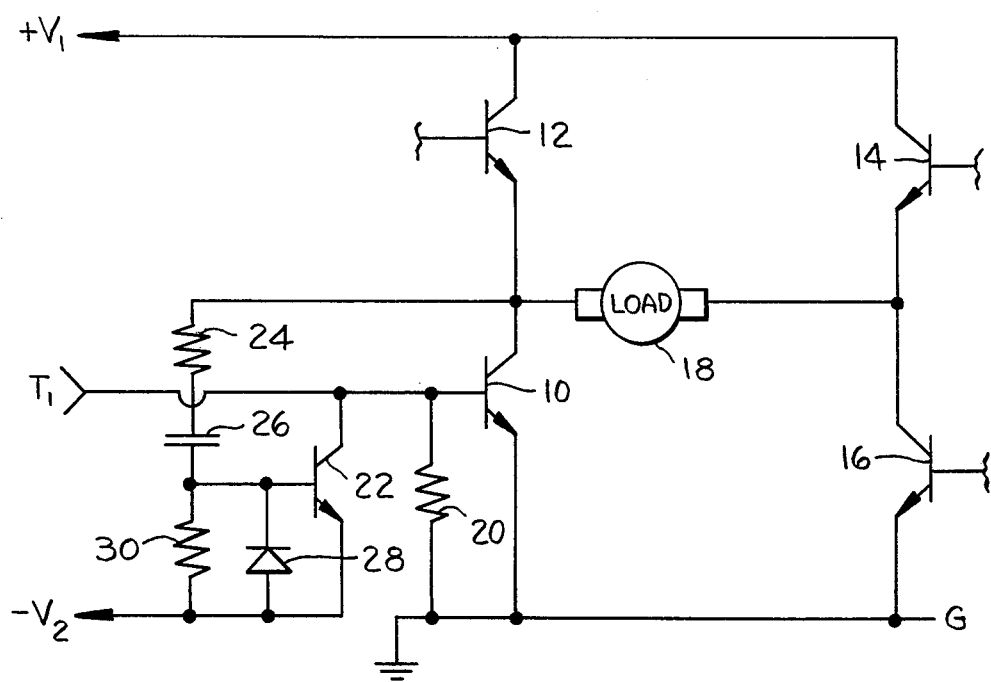

FAST TURN-OFF CIRCUIT FOR POWER TRANSISTOR

BACKGROUND OF THE INVENTION

1. Field of the Invention

This invention relates to a circuit which reduces the turn-off time of a power transistor.

2. Description of the Prior Art

When power transistors are used as the switching means to drive a heavy load, such as in pulse width modulated servo systems, upon discontinuance of the drive signal to the base of the power transistor, the power transistor does not turn off immediately due to the well known time delay storage effect present in all transistor devices. As soon as the storage delay has lapsed, the voltage across the collector to emitter of the transistor begins to rise. However, the transistor is still at this time drawing significant load current. Thus, the power dissipated by the transistor is at a maximum value. In order to insure that the transistor will not fail due to the generation of heat when the transistor is turning off, it is often necessary to encumber the equipment with elaborate heat sinking means to further dissipate the heat from the transistor. Such heat sinking means at times will increase the size and cost of equipment beyond permissable bounds. At other times, such heat sinking means may not be sufficient to avoid the failure of the power transistor, and the system may have to operate at substantially reduced load current levels.

OBJECTS OF THE INVENTION

It is therefore an object of this invention to provide an increase in the load current carrying capability of power transistors by reducing the power dissipation thereacross during the time that the power transistors are being switched from the saturated "on" condition to the "off" condition.

It is another object of this invention to provide means for insuring a faster turn off of power transistors to enable these transistors to drive heavier current loads than would otherwise be permissable.

Other objects of the invention will be pointed out hereinafter.

SUMMARY OF THE INVENTION

According to a broad aspect of the invention, there is provided a system for energizing a load from a voltage source which is comprised of a power transistor and regenerative feedback means coupled between a collector and base of the power transistor for only feeding back to the base of the power transistor a signal responsive to an increasing potential which appears at the collector to reduce the time necessary to turn off the power transistor. The power transistor is connected in series with the load and is positioned between terminals of a voltage source to provide a low impedance path for the load when a drive signal is received at the base of the power transistor.

The regenerative feedback means can be comprised of a second transistor having a collector electrically coupled to the base of the power transistor. The feedback means is further comprised of transient circuit means including a series combination of a resistor and capacitor connected between the collector of the power transistor and the base of the second transistor for causing the second transistor to saturate when the potential across the collector to emitter of the power transistor is in the process of increasing.

BRIEF DESCRIPTION OF THE DRAWING

The sole FIGURE shows a plurality of power transistors used to drive a load, wherein a regenerative feedback means is only disclosed for one power transistor, which feedback means is used to decrease the turn-off time of the power transistor.

DESCRIPTION OF THE PREFERRED EMBODIMENT

Power transistors 10, 12, 14 and 16 will be used to drive a load 18 between a voltage source designated by a terminal $+V_1$ and a terminal G (i.e. circuit ground). In this particular example, drive signals can be respectively applied to the base of transistors 10 and 14 to allow current to flow through the load in a first direction from the voltage source and, at another point in time, drive signals can be respectively applied to the base of transistors 12 and 16 to allow current to flow through the load in an opposite direction. Load 18 by way of example can comprise a servo motor. The drive circuitry for the servo motor including the drive signals applied to the base of the power transistors, can comprise a pulse width modulated system for driving a servo load. Inasmuch as the drive signal which is applied to the base of a power transistor and the regenerative feedback means used to provide quick turn-off for a power transistor are substantially identical for each power transistor, a drive signal receiving terminal and regenerative feedback means will only be shown with respect to power transistor 10.

Again, as shown in the drawing, the emitters of power transistors 10 and 16 are connected to circuit ground, while the collectors of power transistors 10 and 16 are connected to opposite ends of load 18. The emitters of power transistors 12 and 14 are respectively connected to the collectors of power transistors 10 and 16, while the collectors of transistors 12 and 14 are connected to the $+V_1$ terminal of the power supply. Referring only to transistor 10, a drive signal is received at a terminal $T_1$ from a conventional source (not shown) and is applied to the base of power transistor 10 for driving power transistor 10 into saturation and turning it "on." A biasing resistor 20 is connected between the base and emitter of power transistor 10.

The regenerative feedback means for power transistor 10 is provided by a second transistor 22, transient circuit means which includes a series connected resistor 24 and capacitor 26, a clamping diode 28 and a biasing resistor 30. The collector of transistor 22 is connected to the base of power transistor 10, while the emitter of second transistor 22 is connected to one terminal of a second voltage source having a terminal designated as $-V_2$, wherein the other terminal of this voltage source is connected to circuit ground. The series combination of resistor 24 and capacitor 26 is connected between the collector of transistor 10 and the base of transistor 22. Biasing resistor 30 is connected between the base and emitter of transistor 22. The cathode of diode 28 is connected to the base of transistor 22, while the anode of diode 28 is connected to the emitter of transistor 22. Since transistor 22 is shown as an NPN transistor, it should be observed that diode 28 is connected in a reverse parallel relationship to the diode formed by the base to emitter junction of NPN transistor 22.

While all of the transistors shown in the drawing are shown as NPN transistors, it should be understood that each of these transistors could easily be shown as PNP transistors. In the event that the transistors were PNP transistors, the polarity of the voltage supplies at terminals $V_1$ and $V_2$ would be reversed and the poling direction of diode 28 would also be reversed. By way of example only, if a D.C. power supply were used such that $+V_1$ were +90 volts, then $-V_2$ of the second D.C. supply could be approximately −2.5 volts.

In operation, when a drive signal is applied at terminal $T_1$ and is of sufficient magnitude to drive transistor 10 into saturation, transistor 10 turns on and the voltage drop across transistor 10 reduces to a nominal value (usually less than 1 volt). If transistor 14 is also simultaneously turned on, current passes from terminal $+V_1$ through the collector-to-emitter of transistor 14, load 18 and the collector-to-emitter of transistor 10 to circuit ground. After the drive signal is removed from terminal $T_1$, transistor 10 remains on for a defined period of time determined by the well known time delay storage of the device. At the end of the period defined by its storage time delay, transistor 10 begins to turn off and the voltage across the collector-to-emitter begins to rise. The increasing voltage at the collector of transistor 10 is coupled through transient circuit means comprised of resistor 24 and capacitor 26 to the base of transistor 22. This causes transistor 22 to be driven into saturation and the negative $-V_2$ voltage at the emitter of transistor 22 is effectively applied to the base of transistor 10 to provide a reverse biasing potential at the base of transistor 10, which, in turn, causes transistor 10 to turn off even faster, which results in hastening the extinguishing of current flowing through the collector-to-emitter of transistor 10. As a consequence, the dissipation of power by the power transistor is reduced. Thus, as a result of the regenerative feedback means, transistor 10 can operate to drive a load at higher current levels than might otherwise be possible. At this point, it should be noted that the values of resistor 24 and capacitor 26 should be selected so that their RC time constant is sufficient to insure that transistor 22 be driven into saturation for a time long enough to further insure that transistor 10 will be completely turned off as soon as possible.

It should be noted that as soon as a drive signal is applied to transistor 10, the collector-to-emitter voltage across the transistor begins to decrease, and the decreasing potential at the collector of transistor 10, which normally would be fed back to the base of transistor 22 via resistor 24 and capacitor 26, will reverse bias the base-to-emitter junction of transistor 22 and this fed back voltage across the base-to-emitter junction is clamped at the less than one volt forward voltage drop across diode 28. In this manner, diode 28 protects transistor 22 from being destroyed by large reverse biasing feedback signals which other wise would destroy the base-to-emitter junction of transistor 22. Thus, the regenerative feedback signals from the collector of transistor 10 will only affect a change in the operation of transistor 10 when the potential across the collector-to-emitter of the transistor is increasing in absolute magnitude.

While power transistor 10 is shown to be in series with load 18 and another power transistor 14, which series combination is positioned between a power source, it should be understood that power transistor 10 and a load could be in series with and directly positioned between terminals of a D.C. power source.

Although this invention has been described with reference to a specific embodiment thereof, numerous modifications are possible without departing from the invention, and it is desirable to cover all modifications falling within the spirit and scope of this invention.

What I claim as new and desire to secure by Letters Patent of the United States is:

1. In a system for energizing a load from a voltage source having first and second terminals, the combination comprising:
   a. a power transistor having an emitter, base and collector with its collector-to-emitter path connected in series with the load and between the terminals of the voltage source to provide a low impedance path for the load when a drive signal is received at said base; and
   b. regenerative feedback means coupled between said collector and base of said power transistor for only feeding back to said base a signal responsive to an increasing potential sensed at said collector to reduce the time necessary to turn off said power transistor, said feedback means comprising:
      i. a second transistor having an emitter, base and collector, said collector of said second transistor being electrically coupled to said base of said power transistor;
      ii. transient circuit means including a series circuit combination of a resistor and a capacitor connected between said collector of said power transistor and said base of said second transistor for causing saturation of said second transistor when the voltage across the collector to emitter of said power transistor is in the process of increasing; and
      iii. a diode connected directly across the base-to-emitter of said second transistor in a reverse polarity relationship to protect a base-to-emitter junction of said second transistor from being destroyed by a reverse biasing feedback signal responsive to a decreasing potential at said collector of said power transistor when said power transistor is being driven into saturation by a signal applied to said base of said power transistor.

2. In a system according to claim 1, wherein said regenerative feedback means is further comprised of a D.C. voltage source having one terminal connected to said emitter of said second transistor for causing a reverse biasing potential to be applied to said base of said power transistor to hasten the turn off of said power transistor when said second transistor is driven into saturation.

* * * * *